US009576942B1

(12) United States Patent
Karhade et al.

(10) Patent No.: US 9,576,942 B1
(45) Date of Patent: Feb. 21, 2017

(54) INTEGRATED CIRCUIT ASSEMBLY THAT INCLUDES STACKED DICE

(71) Applicant: Intel Corporation, Santa Clara, CA (US)

(72) Inventors: Omkar Karhade, Chandler, AZ (US); Nitin Deshpande, Chandler, AZ (US); Bassam M. Ziadeh, Gilbert, AZ (US); Yoshihiro Tomita, Tsukuba (JP)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/974,811

(22) Filed: Dec. 18, 2015

(51) Int. Cl.
*H01L 23/02* (2006.01)
*H01L 25/18* (2006.01)
*H01L 23/31* (2006.01)
*H01L 23/48* (2006.01)
*H01L 23/00* (2006.01)
*H01L 25/065* (2006.01)
*H01L 23/498* (2006.01)
*H01L 23/538* (2006.01)

(52) U.S. Cl.
CPC .......... *H01L 25/18* (2013.01); *H01L 23/3142* (2013.01); *H01L 23/481* (2013.01); *H01L 23/49838* (2013.01); *H01L 23/5389* (2013.01); *H01L 24/32* (2013.01); *H01L 24/49* (2013.01); *H01L 24/73* (2013.01); *H01L 25/0657* (2013.01); *H01L 2224/2919* (2013.01); *H01L 2224/32145* (2013.01); *H01L 2224/48225* (2013.01); *H01L 2224/73265* (2013.01); *H01L 2225/06541* (2013.01); *H01L 2225/06555* (2013.01); *H01L 2924/0665* (2013.01); *H01L 2924/14* (2013.01); *H01L 2924/1434* (2013.01); *H01L 2924/15153* (2013.01)

(58) Field of Classification Search
CPC .... H01L 25/18; H01L 23/3142; H01L 23/481; H01L 23/49838; H01L 25/0657; H01L 24/32; H01L 24/49; H01L 24/73
USPC ......................................... 257/686, 777, 690
See application file for complete search history.

(56) References Cited

U.S. PATENT DOCUMENTS

| | | | | |
|---|---|---|---|---|
| 5,444,300 A * | 8/1995 | Sato | ...................... | H01L 23/367 257/587 |
| 5,619,070 A * | 4/1997 | Kozono | .............. | H01L 23/3121 257/692 |
| 5,973,392 A * | 10/1999 | Senba | .................. | H01L 25/0652 257/685 |
| 6,201,301 B1 * | 3/2001 | Hoang | .................. | H01L 21/563 257/712 |
| 6,291,267 B1 * | 9/2001 | Dore | ...................... | H01L 21/563 257/E21.503 |

(Continued)

*Primary Examiner* — Nitin Parekh
(74) *Attorney, Agent, or Firm* — Schwegman Lundberg & Woessner, P.A.

(57) ABSTRACT

An integrated circuit assembly that includes a substrate; a member formed on the substrate; a first die mounted to the substrate within an opening in the member such that there is space between the first die and the member and the member surrounds the first die, and wherein the first die does not extend above an upper surface of the member; an underfill between the first the die and the substrate, wherein the underfill at least partially fills the space between the die and member; and a second die mounted to the first die and the member, wherein the second die is mounted to the member on all sides of the opening.

14 Claims, 4 Drawing Sheets

(56) References Cited

U.S. PATENT DOCUMENTS

| | | | | |
|---|---|---|---|---|
| 6,294,406 B1* | 9/2001 | Bertin | ................ | H01L 25/0657 257/777 |
| 6,414,381 B1* | 7/2002 | Takeda | ................... | H01L 23/16 257/676 |
| 6,659,512 B1* | 12/2003 | Harper | ............... | H01L 25/0657 257/777 |
| 6,664,643 B2* | 12/2003 | Emoto | ................... | H01L 23/16 257/723 |
| 6,930,378 B1* | 8/2005 | St. Amand | ......... | H01L 25/0657 257/685 |
| 8,791,562 B2* | 7/2014 | Lee | ................... | H01L 25/0655 257/612 |
| 2012/0205800 A1* | 8/2012 | Shen | ................ | H01L 21/76898 257/737 |
| 2013/0127054 A1* | 5/2013 | Muthukumar | ...... | H01L 23/3121 257/738 |

* cited by examiner

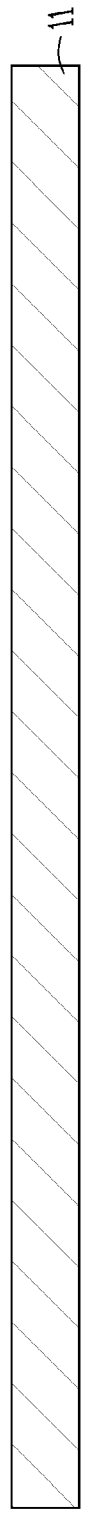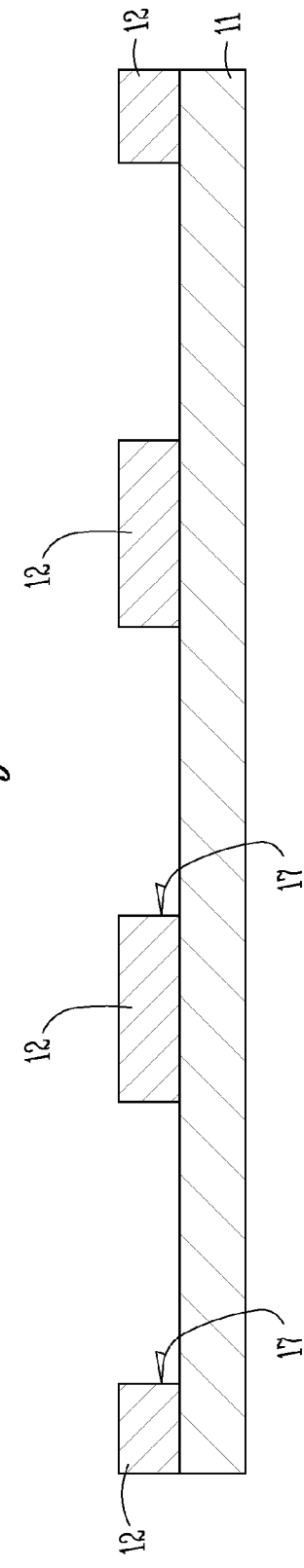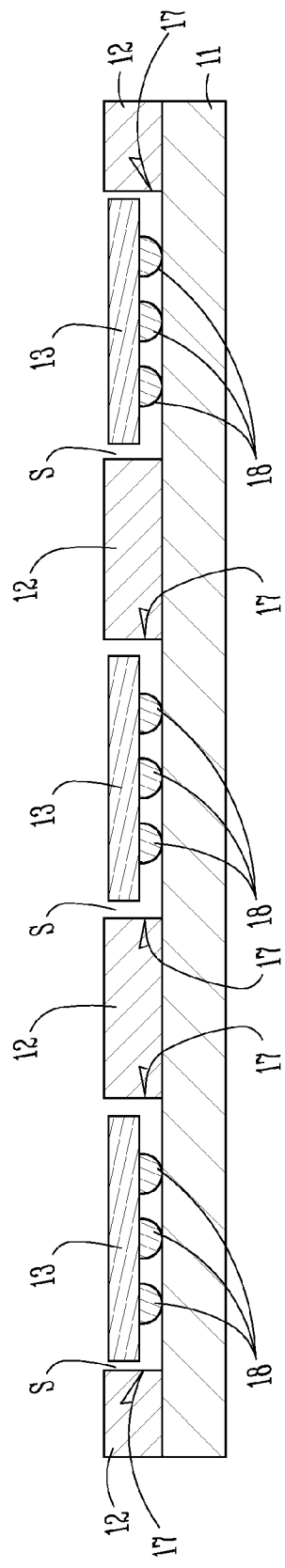

INTEGRATED CIRCUIT ASSEMBLY THAT INCLUDES STACKED DICE

TECHNICAL FIELD

Embodiments described herein generally relate to an integrated circuit assembly, and more particularly to an integrated circuit assembly that includes stacked dice.

BACKGROUND

Mobile products (e.g., mobile phones, smart phones, tablet computers, etc.) are typically very restricted in available space because there are often severe limitations for chip and package area and height (among other physical and electrical parameters). Therefore, it is extremely important to reduce the size of electronic components (e.g., dies) on a substrate.

However, when electronic components/packages are made relatively thin in order to accommodate this need for reduced sized electronic components, there can be difficulties that are associated with fabricating such components. As an example, stacking thin components/packages have historically been a huge challenge for the semiconductor industry.

Some conventional integrated circuit (IC) assemblies include three dimensional (3D) package architectures where one or more dies (e.g., memory dies) are stacked on another die (e.g., to form a system-on-chip die). The stacked dies may overhang the underlying die in some configurations. This overhanging configuration often results in cracking (or other types of defects) in the stacked dies.

Therefore, the degree of overhang in conventional stacked electronic systems may be restricted in order to mitigate any type of defect that may be caused by the overhanging configuration. In addition, since stacked electronic packages often include electronic packages of different sizes, it may be desirable to package architectures that compensate for such differences in electronic package size, especially for smaller devices (e.g., mobile devices or wearables).

BRIEF DESCRIPTION OF THE DRAWINGS

FIG. 1 illustrates an example substrate.

FIG. 2 illustrates the example substrate of FIG. 1 with a member formed on the substrate.

FIG. 3 illustrates the example substrate and member of FIG. 2 with a die attached to the substrate.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

The integrated circuit assemblies described herein may provide support to the top dice and a stack of dices where the top dice overhangs the underlying dice or stack of dices in some configuration. The support provided by the integrated circuit assemblies may serve to prevent unsupported top dice (e.g., a memory dice) from bending or breaking during fabrication or operation of the integrated circuit assembly.

Figure 4:
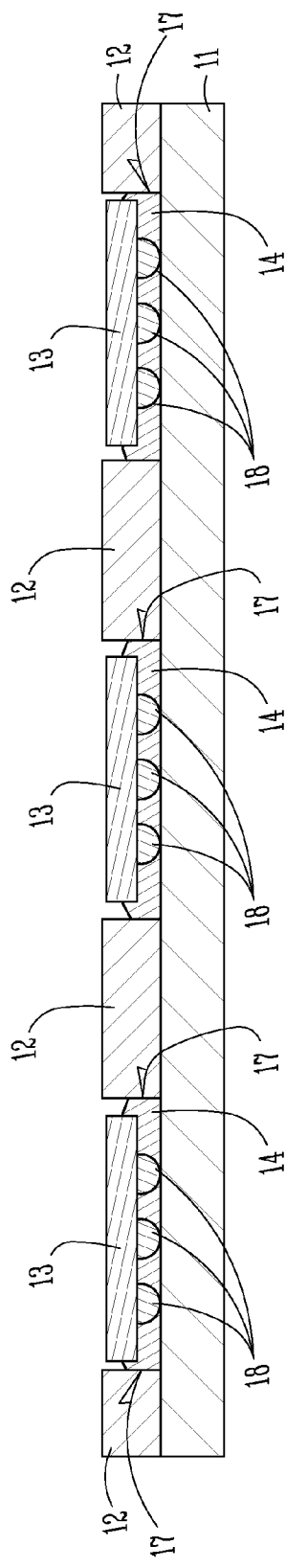
FIG. 4 illustrates the example substrate, member and die of FIG. 3 with an underfill added between the die and the substrate and the die and the member.
Figure 5:
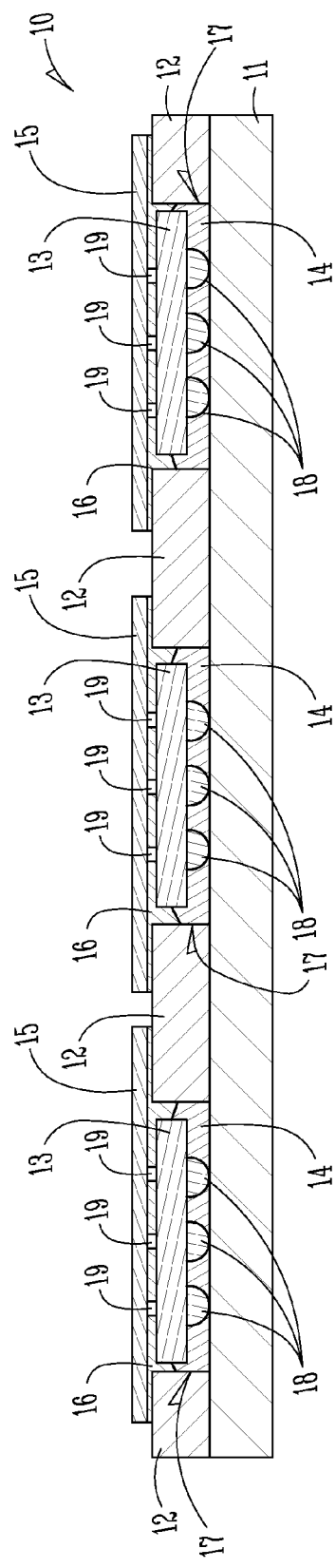
FIG. 5 illustrates the example substrate, member and die of FIG. 4 with another die mounted to the member and the die.

FIGS. 1-5 illustrate an example process for forming an integrated circuit assembly 10. FIG. 1 illustrates an example substrate 11. FIG. 2 illustrates the example substrate 11 of FIG. 1 with a member 12 formed on the substrate 11. FIG. 3 illustrates the example substrate 11 and member 12 of FIG. 2 with a first die 13 (or multiple first dice 13) attached to the substrate 11. FIG. 4 illustrates the example substrate 11, member 12 and first dice 13 of FIG. 3 with an underfill 14 added between the dice 13 and the substrate 11 as well as between the dice 13 and the member 12. FIG. 5 illustrates the example substrate 11, member 12 and first dice 13 of FIG. 4 with second dice 15 mounted to the member 12 and the respective dice 13.

As shown in FIG. 5, the integrated circuit assembly 10 includes a substrate 11 and a member 12 formed on the substrate 11. A first die 13 is mounted to the substrate 11 within an opening 17 in the member 12 such that there is space S between the first die 13 and the member 12. As an example, the first dice 13 may be an active component (e.g., a logic die). In the example integrated circuit assembly 10 shown in FIG. 5, there is a plurality of first dice 13 mounted to the substrate 11 within the respective openings 17 in the member 12.

An underfill 14 is between each of the first dice 13 and the substrate 11. The underfill 14 at least partially fills the spaces S between the respective first dice 13 and the member 12. In some forms, the underfill 14 will entirely fill the space S between the first dice 13 and the member 12. In addition, it may be desirable for the underfill 14 to not extend above the first dice 13.

As shown in FIG. 5, a second die 15 is mounted to the first die 13 and the member 12. In the example integrated circuit assembly 10 shown in FIG. 5, a plurality second dice 15 are mounted to a respective one of the first dice 13 and the member 12.

As shown in FIG. 5 the second dice 15 may be mounted to the respective first dice 13 and the member 12 using an epoxy 16. The epoxy 16 may serve to form an electrical connection. It should be noted that the second dice 15 may be mounted to the first dice 13 in any manner that is known now, or discovered in the future. The manner in which the second dice 15 are mounted to the first dice 13 and the member 12 will depend in part on the materials that are used to form the second dice 15, the first dice 13 and the member 12 as well as the manufacturing techniques that are used to fabricate the integrated assembly 10 (among other factors).

In some forms, the first dice 13 are thermal bonded to the substrate 11. It should be noted that other forms of attachment are contemplated for mounting the first dice 13 to the substrate 11. The manner in which the first dice 13 are bonded to the substrate 11 will depend in part on the type of substrate 11 that is included in the integrated circuit assembly 10 as well as the type of first dice 13 that are included in the integrated circuit assembly 10. In the example integrated circuit assembly 10 shown in FIG. 5, the first dice 13 includes solder balls 18 that are mounted on the substrate 11.

As an example, the second dice 15 may be flip-chip mounted to the first dice 13. As shown in FIG. 5, interconnects 19 may electrically connect the second dice 15 to the respective first dice 13. It should be noted that interconnects 19 may be any form (or combination of) solder balls, solder pads, vias, and/or pillars (among other forms of electrical connection).

In some forms, the second dice 15 are mounted to the member 12 on all sides of the respective openings 17. It should be noted that the second dice 15 may be mounted to the member 12 on one, some or all sides of the openings 17. The areas where the second dice 15 are mounted to the member 12 will depend in part on the size of the second dice 15 and the size of the respective openings 17 (among other factors).

In some forms, the second dice 15 may be a passive electronic component that is not electrically connected directly to the first dice 13. In addition, the second dice 15 may be electrically connected to the substrate 11. As examples, the second dice 15 may be wire bonded to the substrate 11, or the member 12 may include interconnects (not shown) that electrically connect the second dice 15 to the substrate 11.

As examples, one, some or all of the first dice 13 may form a system-on-chip die. It should be noted that the first dice 13 may be any type of die that is known now, or discovered in the future. The type of first dice 13 that are included in the integrated circuit assembly 10 will depend in part on the application where the integrated circuit assembly 10 is to be used (among other factors).

As examples, one, some, or all of the second dice 15 may be memory, logic and/or modem. It should be noted that the second dice 15 may be any type of dice that is known now, or discovered in the future. The type of second dice 15 that included in the integrated circuit assembly 10 will depend in part on the application where the integrated circuit assembly 10 is to be used (among other factors).

As an example, the second dice 15 may be less than 250 micrometers thick. The thickness of the second dice 15 will depend on the type of second dice 15 that are included in the integrated circuit assembly 10.

The degree to which each of the second dice 15 overhangs the member 12 will depend in part on the size of the second dice 15 and the respective first dice 13 as well as the size of the openings 17 (among other factors). As an example, the second dice 15 may overhang the member 12 by anywhere between 500 and 3000 micrometers.

It should be noted that even though FIG. 5 illustrates the integrated assemblies 10 in strip form, the integrated circuit assemblies 10 may be singulated to form individual electronic packages. In addition, the integrated circuit assemblies 10 may be fabricated at a wafer or panel level.

Figure 6:
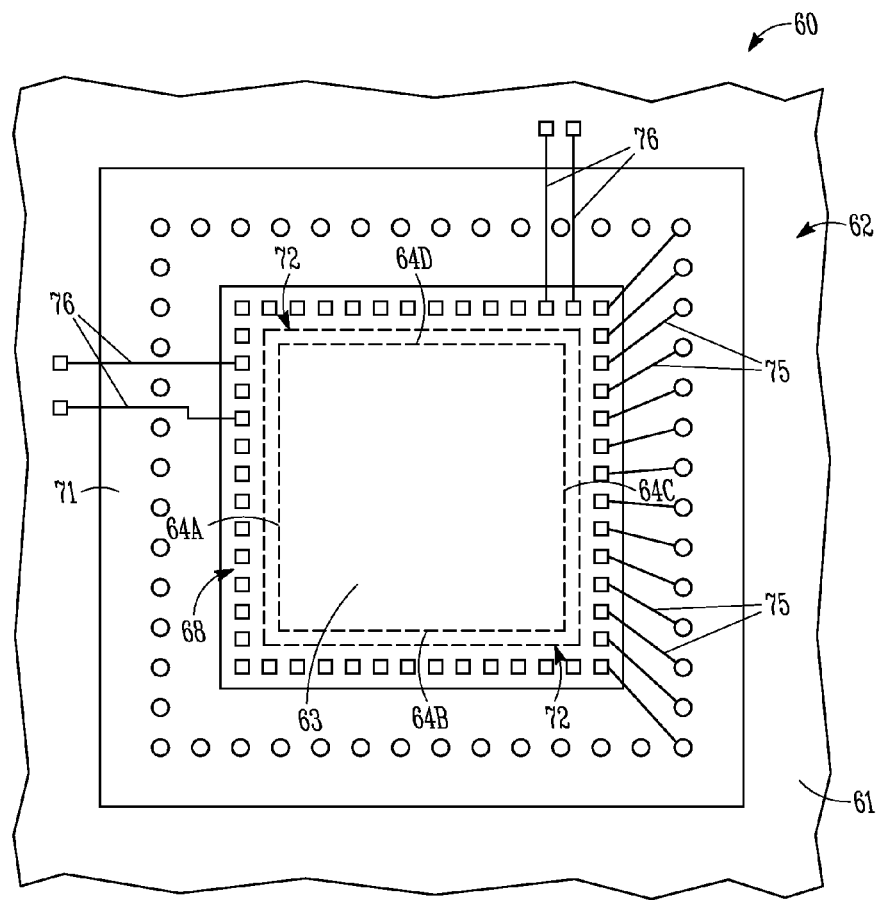
FIG. 6 is a top view of an example electronic assembly.
Figure 7:
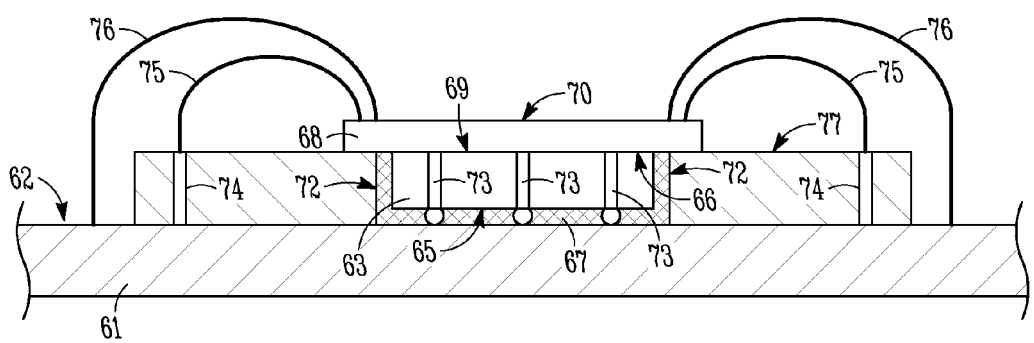
FIG. 7 is a side view of the example electronic assembly shown in FIG. 6.

FIG. 6 is a top view of an example electronic assembly 60. FIG. 7 is a side view of the example electronic assembly 60 shown in FIG. 6.

The electronic assembly 60 includes a substrate 61 with a die side 62. The electronic assembly 60 further includes a first die 63 including four edges 64A, 64, 64C, 64D, a first-die active surface 65, and a first die backside surface 66. The first-die active surface 65 is mounted to the substrate die side 62.

An underfill 67 (see FIG. 7) is between the first die 63 and the substrate 61. A second die 68 includes a second-die active surface 69 and a second-die backside surface 70. The second-die active surface 69 is mounted to the first die backside surface 66. The second die 68 overhangs the first die 63 on all four edges 64A, 64, 64C, 64D.

The electronic assembly 60 may further include a mold 71 that forms an opening 72 onto the substrate 61 in which the first die 63 is mounted. In some forms, the second die 68 may also be mounted to the mold 71 at a surface 77 of the substrate 61 that is substantially coplanar with the first die backside surface 66.

The first die 63 may be a system-on-chip die and the second die 68 may be a memory die. Other types of dice are contemplated for inclusion into the electronic assembly 60.

In some forms, the first die 62 may include through silicon vias 73 that electrically connect the second die 68 to the substrate 61 (see FIG. 7). In addition, the mold 71 may include through mold vias 74 that electrically connect the second die 68 to the substrate 61.

In the example form of the electronic assembly 60 that is illustrated in FIGS. 6 and 7, the second-die backside surface 70 is wire bonded to the surface 72 of the mold 71 (e.g., using leads 75). It should be noted that the second-die backside surface 70 may also (or alternatively) be wire bonded to the substrate die side 62 (e.g., using leads 76).

Figure 8:
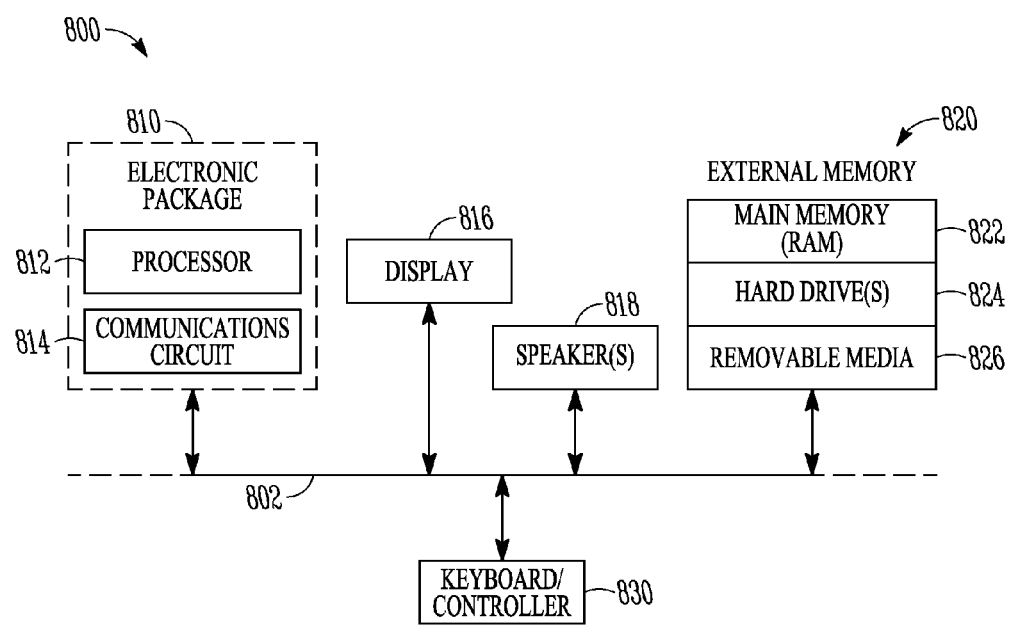
FIG. 8 is block diagram of an electronic apparatus that includes the integrated circuit assemblies described herein.

FIG. 8 is a block diagram of an electronic apparatus 800 incorporating at least one method electronic package described herein. Electronic apparatus 800 is merely one example of an electronic apparatus in which forms of the electronic packages 10, 20, 30 described herein may be used. Examples of an electronic apparatus 800 include, but are not limited to, personal computers, tablet computers, mobile telephones, game devices, MP3 or other digital music players, etc.

In this example, electronic apparatus 800 comprises a data processing system that includes a system bus 802 to couple the various components of the electronic apparatus 800. System bus 802 provides communications links among the various components of the electronic apparatus 800 and may be implemented as a single bus, as a combination of busses, or in any other suitable manner.

An electronic assembly 810 as describe herein may be coupled to system bus 802. The electronic assembly 810 may include any circuit or combination of circuits. In one embodiment, the electronic assembly 810 includes a processor 812 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in electronic assembly 810 are a custom circuit, an application-specific integrated circuit (ASIC), or the like, such as, for example, one or more circuits (such as a communications circuit 814) for use in wireless devices like mobile telephones, tablet computers, laptop computers, two-way radios, and similar electronic systems. The IC can perform any other type of function.

The electronic apparatus 800 may also include an external memory 820, which in turn may include one or more memory elements suitable to the particular application, such as a main memory 822 in the form of random access memory (RAM), one or more hard drives 824, and/or one or more drives that handle removable media 826 such as compact disks (CD), flash memory cards, digital video disk (DVD), and the like.

The electronic apparatus 800 may also include a display device 816, one or more speakers 818, and a keyboard and/or controller 830, which can include a mouse, trackball, touch screen, voice-recognition device, or any other device that permits a system user to input information into and receive information from the electronic apparatus 800.

To better illustrate the integrated circuit assemblies disclosed herein, a non-limiting list of examples is provided here:

Example 1 includes an integrated circuit assembly that includes a substrate; a member formed on the substrate; a first die mounted to the substrate within openings in the member such that there is space between the first die and the member; an underfill between the first the die and the substrate, wherein the underfill at least partially fills the space between the die and member; and a second die mounted to the first die and the member.

Example 2 includes the integrated circuit assembly of example 1, wherein an epoxy partially fills the space between the first die and the member, and the epoxy attaches the second die to the first die.

Example 3 includes the integrated circuit assembly of any one of examples 1-2, wherein the second die is mounted to the member on all sides of the opening.

Example 4 includes the integrated circuit assembly of any one of examples 1-3, wherein the first die is below an upper surface of the member.

Example 5 includes the integrated circuit assembly of any one of examples 1-4, wherein an upper surface of the first die is coplanar with an upper surface of the member.

Example 6 includes the integrated circuit assembly of examples 1-5, wherein the first die is a system-on-chip die, and wherein the second die is a memory die.

Example 7 includes the integrated circuit assembly of any one of examples 1-6, wherein the underfill fills the space between the die and member.

Example 8 includes the integrated circuit assembly of any one of examples 1-7, wherein the second die is less than 250 micrometers thick, wherein the second die overhangs the member by between 500 and 3000 micrometers.

Example 9 includes the integrated circuit assembly of any one of examples 1-8, wherein the first die includes through silicon vias that electrically connect the second die to the substrate.

Example 10 includes the integrated circuit assembly of any one of examples 1-9, wherein the member includes through member vias that electrically connect the second die to the substrate.

Example 11 includes the electronic assembly of any one of examples 1-10, wherein an upper surface of the second die is wire bonded to an upper surface of the member.

Example 12 includes the electronic assembly of any one of examples 10-11, wherein an upper surface of the second die is wire bonded to the substrate.

Example 13 includes an integrated circuit assembly that includes a substrate; a member formed on the substrate; a first die mounted to the substrate within openings in the member such that there is space between the first die and the member and the member surrounds the first die, and wherein the first die does not extend above an upper surface of the member; an underfill between the first the die and the substrate, wherein the underfill at least partially fills the space between the die and member; and a second die mounted to the first die and the member, wherein the second die is mounted to the member on all sides of the opening.

Example 14 includes the integrated circuit assembly of example 13, wherein the second die is mounted to the first die and the member using an epoxy, and wherein the epoxy at least partially fills the space between the die and member.

Example 15 includes the integrated circuit assembly of any one of examples 13-14, wherein the first die is thermal compression bonded to the substrate, and wherein the second die is flip-chip mounted to the first die.

Example 16 includes the integrated circuit assembly of any one of examples 13-15, wherein the first die is a system-on-chip die, and wherein the second die is a memory die.

Example 17 includes the integrated circuit assembly of any one of examples 13-16, wherein the second die is less than 250 micrometers thick, and wherein the second die overhangs the member by between 500 and 3000 micrometers.

Example 18 includes an integrated circuit assembly. The integrated circuit assembly includes a substrate with a die side; a first die including four edges, a first-die active surface, and a first-die backside surface, wherein the first-die active surface is mounted to the substrate die side; an underfill between the first die and the substrate; a second die including a second-die active surface and a second-die backside surface, wherein the second-die active surface is mounted to the first die backside surface, and wherein the second die overhangs the first die on all four edges.

Example 19 includes the integrated circuit assembly of example 18, and further including a mold that forms an opening onto the substrate in which the first die is mounted.

Example 20 includes the integrated circuit assembly of examples 18-19, wherein the second die is also mounted to an upper surface of the mold substrate that is substantially coplanar with the first-die backside surface.

Example 21 includes the integrated circuit assembly of examples 18-20, and further including a mold that forms an opening onto the substrate in which the first die is mounted, and wherein the second die is also mounted to an upper surface of the mold substrate that is substantially coplanar with the first-die backside surface Example 22 includes the integrated circuit assembly of examples 18-21, and further including a mold that forms an opening onto the substrate in which the first die is mounted, wherein the second die is also mounted to an upper surface of the mold substrate that is substantially coplanar with the first-die backside surface, and wherein the first die is a system-on-chip die and the second die is a memory die.

This overview is intended to provide non-limiting examples of the present subject matter. It is not intended to provide an exclusive or exhaustive explanation. The detailed description is included to provide further information about the integrated circuit assemblies described herein.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description.

The Abstract is provided to comply with 37 C.F.R. §1.72(b), to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An integrated circuit assembly, comprising:
    a substrate;
    a member on the substrate;
    a first die mounted to the substrate within an opening in the member such that there is space between the first die and the member;
    an underfill between the first the die and the substrate, wherein the underfill at least partially fills the space between the die and member; and
    a second die mounted to the first die and the member, wherein an epoxy partially fills the space between the first die and the member, and the epoxy attaches the second die to the first die, wherein the underfill and the epoxy are both partially in contact with the member.

2. The integrated circuit assembly of claim 1, wherein the second die is mounted to the member on all sides of the opening.

3. The integrated circuit assembly of claim 1, wherein the first die is below an upper surface of the member.

4. The integrated circuit assembly of claim 1, wherein an upper surface of the first die is coplanar with an upper surface of the member.

5. The integrated circuit assembly of claim 1, wherein the first die is a system-on-chip die, and wherein the second die is a memory die.

6. The integrated circuit assembly of claim 1, wherein the second die is less than 250 micrometers thick, wherein the second die overhangs the member by between 500 and 3000 micrometers.

7. The integrated circuit assembly of claim 1, wherein the first die includes through silicon vias that electrically connect the second die to the substrate.

8. The integrated circuit assembly of claim 1, wherein the member includes through member vias that electrically connect the second die to the substrate.

9. The integrated circuit assembly of claim 1, wherein an upper surface of the second die is wire bonded to an upper surface of the member.

10. The integrated circuit assembly of claim 1, wherein an upper surface of the second die is wire bonded to the substrate.

11. An integrated circuit assembly, comprising:
    a substrate;
    a member formed on the substrate;
    a first die mounted to the substrate within an opening in the member such that there is space between the first die and the member and the member surrounds the first die, and wherein an upper surface of first die in coplanar with an upper surface of the member;
    an underfill between the first the die and the substrate, wherein the underfill at least partially fills the space between the die and member; and
    a second die mounted to the first die and the member, wherein the second die is mounted to the member on all sides of the opening, wherein the second die is mounted to the first die and the member using an epoxy, and wherein the epoxy at least partially fills the space between the die and member, wherein the underfill and the epoxy are both partially in contact with the member.

12. The integrated circuit assembly of claim 11, wherein the first die is thermal compression bonded to the substrate, and wherein the second die is flip-chip mounted to the first die.

13. The integrated circuit assembly of claim 11, wherein the first die is a system-on-chip die, and wherein the second die is a memory die.

14. The integrated circuit assembly of claim 11, wherein the second die is less than 250 micrometers thick, and wherein the second die overhangs the member by between 500 and 3000 micrometers.

* * * * *